United States Patent [19]

Yagi

[11] Patent Number: 4,715,037

[45] Date of Patent: Dec. 22, 1987

[54] VITERBI DECODER COMPRISING A MAJORITY CIRCUIT IN PRODUCING A DECODED SIGNAL

[75] Inventor: Toshiharu Yagi, Tokyo, Japan

[73] Assignee: NEC Corporation, Japan

[21] Appl. No.: 705,073

[22] Filed: Feb. 25, 1985

[30] Foreign Application Priority Data

Feb. 27, 1984 [JP] Japan ................................ 59-36820

[51] Int. Cl.4 ............................................. G06F 11/10
[52] U.S. Cl. ........................................ 371/43; 371/37
[58] Field of Search ..................... 371/43–46, 371/36–37, 30, 67–68; 364/604, 728

[56] References Cited

U.S. PATENT DOCUMENTS

| | | | |
|---|---|---|---|
| 3,662,338 | 5/1972 | Cain, III ............................ | 371/43 X |
| 3,789,360 | 1/1974 | Clark, Jr. et al. ......... | 340/146.1 AQ |
| 3,831,142 | 8/1974 | Fletcher et al. .................. | 371/43 X |
| 3,872,432 | 3/1975 | Bismarck .................. | 340/146.1 AQ |
| 3,873,971 | 3/1975 | En ..................................... | 371/43 X |
| 4,240,156 | 12/1980 | Doland ................................. | 371/43 |
| 4,500,994 | 2/1985 | McCallister et al. ................. | 371/43 |
| 4,536,878 | 8/1985 | Rattlingourd et al. ............... | 371/43 |
| 4,545,054 | 10/1985 | Davis .................................... | 371/43 |

*Primary Examiner*—Gary V. Harkcom
*Attorney, Agent, or Firm*—Laff, Whitesel, Conte & Saret

[57] ABSTRACT

In a Viterbi decoder for use in producing a decoded signal by correcting and decoding convolutional codes, a majority circuit (46) is connected to a path memory (45). At each of the time slots used for the respective convolutional codes, the majority circuit makes a decision and selects a decoded datum of the decoded signal in response to a majority of information bits which are memorized in the path memory. The Viterbi decoder consists of a read-only memory, which simplifies the circuit, reduces the required number of circuit elements, and makes a lower cost circuit.

2 Claims, 5 Drawing Figures

VITERBI DECODER COMPRISING A MAJORITY CIRCUIT IN PRODUCING A DECODED SIGNAL

BACKGROUND OF THE INVENTION

This invention relates to a Viterbi decoder, namely, a device for use in correcting and decoding convolutional codes in compliance with the Viterbi decoding algorithm known in the art.

A convolutional encoder and a Viterbi decoder associated therewith are capable of reducing code error rates and of increasing an effective signal-to-noise ratio in a digital communication system. In the manner which will later be described more in detail, a conventional Viterbi decoder comprises a correlator; an ACS (addition, comparison, and selection) circuit including a metric memory; a path memory; and a decoded data detecting circuit connected to the path and the metric memories. The path memory is for memorizing, at each of a plurality of time slots or branch intervals for the respective convolutional codes, survivor paths in terms of information bits. These bits are associated with the respective survivor paths of a predetermined number of time slots which include each of the above-mentioned time slots, as a latest one of the predetermined number of time slots. Conventional Viterbi decoders are defective in that the decoded data detecting circuit is complicated and has a large amount of hardware.

SUMMARY OF THE INVENTION

It is therefore an object of the present invention to provide a Viterbi decoder of a simple structure.

It is another object of this invention to provide a Viterbi decoder of the type described, which comprises a decoded data detecting circuit of a simple structure.

It is still another object of this invention to provide a Viterbi decoder of the type described, in which the decoded data detecting circuit has only a relatively small amount of hardware.

It is a further object of this invention to provide a Viterbi decoder of the type described, which has small code error rates, like conventional Viterbi decoders.

It is a still further object of this invention to provide a Viterbi decoder of the type described, which is capable of producing a decoded signal with a short delay.

A Viterbi decoder to which this invention is applicable, is for use in producing a decoded signal by correcting and decoding convolutional codes in synchronism with a succession of time slots and includes a path memory for memorizing, at each of the time slots, survivor paths in terms of information bits associated with the respective survivor paths of a predetermined number of the time slots, which include each of the above-mentioned time slots, as a latest one of the predetermined number of the time slots. According to this invention, the Viterbi decoder is characterised by a majority circuit for deciding a decoded datum of the decoded signal for each of the aforementioned time slots by a majority of the information bits.

DESCRIPTION OF THE PREFERRED EMBODIMENT

Figure 2:
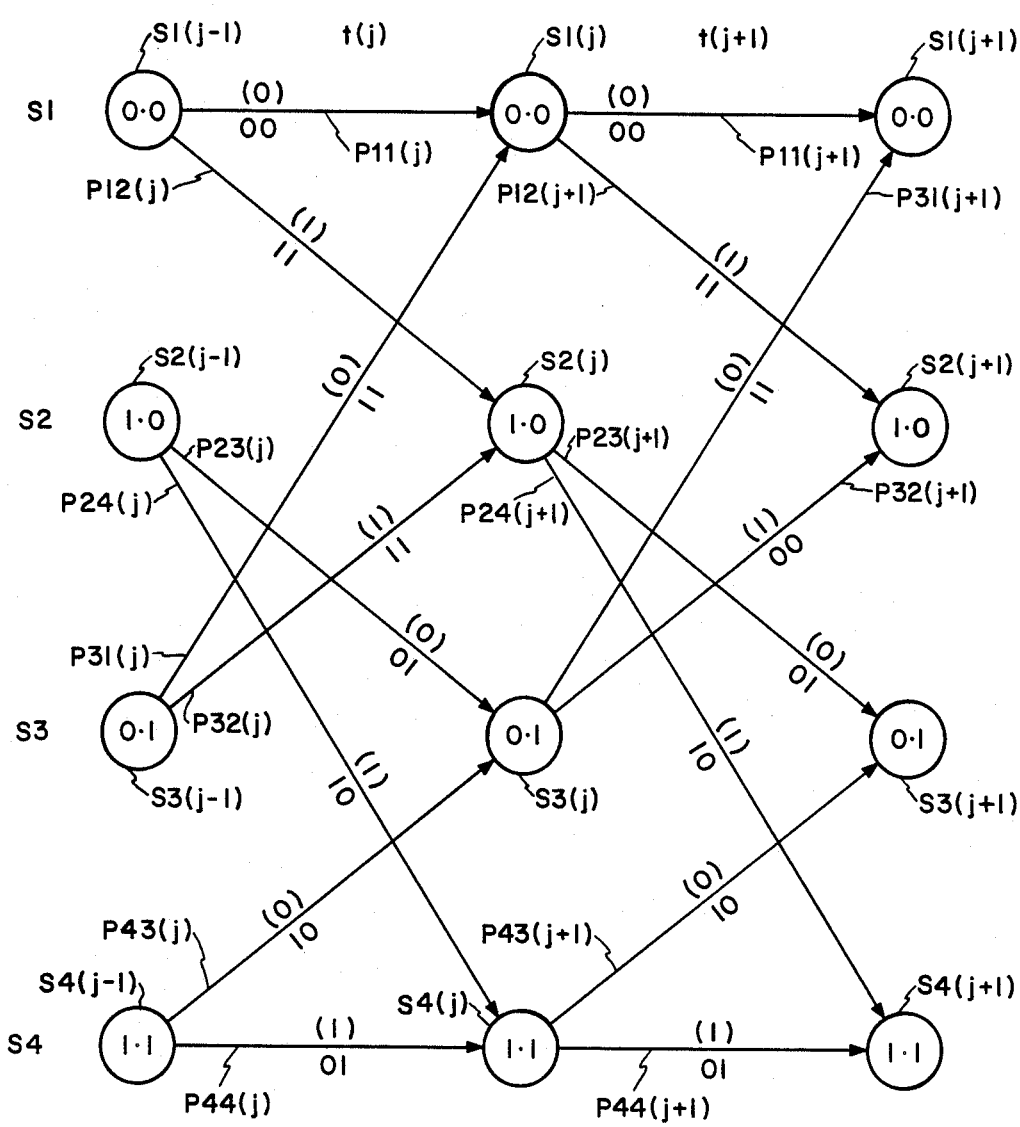
FIG. 2 shows a trellis diagram for the convolutional encoder illustrated in FIG. 1.
Figure 1:
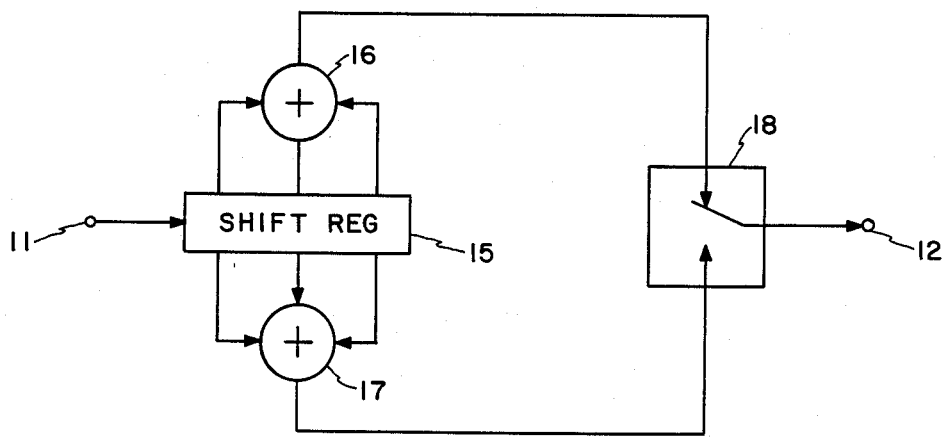
FIG. 1 is a block diagram of a convolutional encoder.
Figure 3:
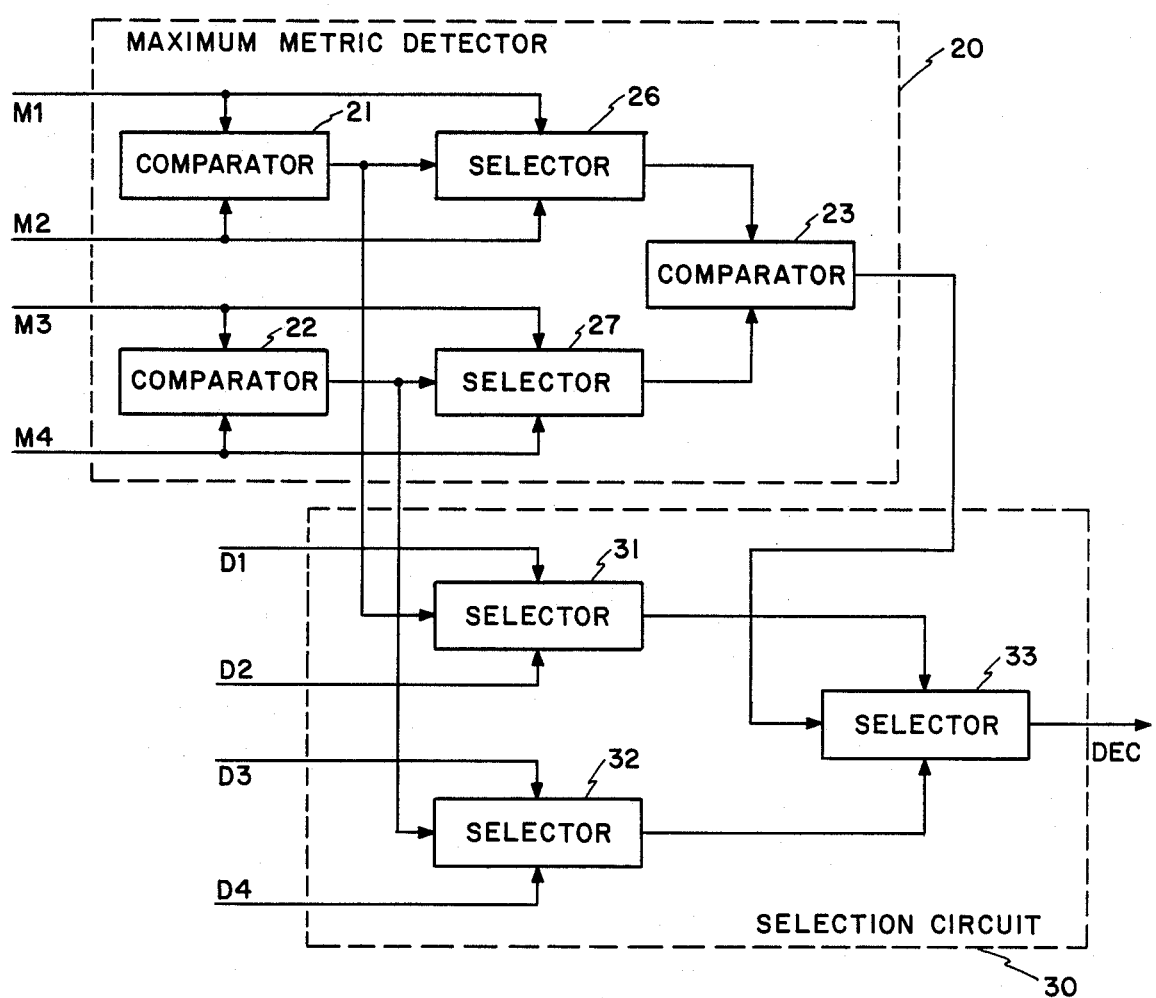
FIG. 3 is a block diagram of a decoded data detecting circuit of a conventional Viterbi decoder.

Referring to FIGS. 1 through 3, a convolutional encoder, a trellis diagram, and a decoded data detecting circuit of a conventional Viterbi decoder will be described at first in order to facilitate an understanding of the present invention.

In FIG. 1, the convolutional encoder is of the type mentioned in U.S. Pat. No. 3,789,360 issued to George Cyril Clark, Jr. et al and assigned to Harris-Intertype Corporation. The convolutional encoder has encoder input and output terminals 11 and 12 to which an original message is supplied and from which an encoded code sequence of encoded code words is delivered to a transmission path or channel (not shown), respectively. It will be assumed in conjunction with the example being illustrated that a shift register 15 has first through third stages (not separately depicted). The first stage is supplied with the original message from the encoder input terminal 11. In the manner known in the art, first and second Exclusive OR circuits 16 and 17 are coupled to the shift register 15 to feed Exclusive OR output signals to a switching circuit 18 which delivers the encoded code sequence to the encoder output terminal 12. In the convolutional encoder being illustrated, the encoded code sequence has a constraint length of three. Each message digit of the original message is encoded into an encoded code word of two symbols. In other words, the original message is encoded into the encoded code sequence with an encoding rate of $\frac{1}{2}$. Each encoded code word is a convolutional code word.

By way of example, let the original message be a succession of binary digits 1, 0, 1, 1, 0, among other digits. The convolutional code words are 11, 01, 00, 10, 10, and so forth in the manner described as a numerical example in the above-referenced Clark, Jr. et al patent. The encoded code sequence may be received by a code error correcting and decoding device as a received code sequence of received code words 11, 11, 00, 10, 00, and so on as a result of code errors which are unavoidably introduced into the encoded code sequence by noise and/or other causes during transmission through the transmission path. Each received code word is a convolutional code word which may or may not have a code error.

In FIG. 2, the trellis diagram represents state transitions of the convolutional encoder illustrated with reference to FIG. 1. The state transitions are among state nodes depicted with circles and take place in timed relation to a succession of time slots or branch intervals ..., t(j), t(j+1), .... It is possible to understand that the trellis diagram defines possible encoded code sequences which the convolutional encoder can produce in response to various original messages. The trellis diagram is conveniently used on describing operation of a Viterbi decoder which is preferred as the code error correcting and decoding device in producing a decoded signal of decoded data or digits with excellent code error correction.

More particularly, a convolutional encoder of a constraint length K has $2^{K-1}$ different states at the end of each time slot. In the convolutional encoder illustrated with reference to FIG. 1, the constraint length is three and the encoding rate is ½. The first and the second shift register stages have first through fourth states S1, S2, S3, and S4 at the end of each time slot, depending on the message digit supplied to the first register stage in the time slot under consideration and on the state which the first and the second register stages had at the end of the time slot which next precedes the time slot in question. The states S1 through S4 are (0, 0), (1, 0), (0, 1), and (1, 1), respectively, in the manner shown at the respective state nodes in the circles. As the case may be, the state nodes will likewise be called "first through fourth state nodes" and designated by "S1" through "S4".

During one of the state transitions in a j-th time slot t(j), a previous state Si'(j−1) varies to a new state Si(j) along a transition path Pi'i(j). The state transition produces a convolutional code word of two symbols 00, 11, 01, or 10 in the manner labelled under the transition path in response to a message digit of 0 and 1, as indicated above the transition path and enclosed with a pair of parentheses. It will be seen that similar patterns of the transition paths appear in the respective time slots when the constraint length is three.

The encoded code words of the above-described numerical example are produced in first through fifth time slots t(1) to t(5), respectively, along transition paths P12(1), P23(2), P32(3), P24(4), and P43(5). In this manner, the encoded code words are produced in synchronism with the respective time slots. The received code words are likewise decoded in synchronism with the time slots. In any event, it is possible to describe each transition path entering each state node by that one bit of information or that information bit which represents one of the message digits indicated above that transition path.

In a Viterbi decoder, a correlator calculates during the j-th time slot t(j) correlation measures between a received code word (x(j), y(j)) and the convolutional code words labelled along two transition paths, such as Pi'i(j), respectively, which enter the state node and is representative of the received code word under consideration. When quantization is into two levels, each correlation measure may be given by the number of same symbols in the two code words for which the correlation measure is calculated.

An ACS (addition, comparison, and selection) circuit calculates a sum by adding each currently calculated correlation measure to each summation of like correlation measures which are previously calculated up to the (j−1)-th time slot t(j−1). That one of the two transition paths is selected as a survivor path for which the sum is greater than another sum calculated for the other of the two transition paths. The summation may therefore be along previously selected survivor paths comprising a recent survivor path which is most recently selected in the (j−1)-th time slot. The greater sum will be named a metric.

In each time slot, first through fourth survivor paths are possible which enter the first through the fourth state nodes S1 to S4, respectively. Information bits descriptive of the first through the fourth survivor paths and consequently associated with the first through the fourth survivor paths will be called "first" through "fourth" information bits and designated by D1, D2, D3, and D4, respectively. Only one of the four survivor paths and therefore one of the first through the fourth information bits D1 to D4 alone is selected in each time slot. First through fourth metrics are possible for the first through the fourth survivor paths, respectively, and will be designated by M1, M2, M3, and M4. Only one of the four metrics M1 through M4 actually increases in each time slot.

A path memory is for memorizing the survivor paths in terms of the information bits D1 through D4 which are associated with the respective survivor paths. A metric memory, which is included in the ACS circuit, memorizes the metrics M1 through M4. The path and the metric memories are referred to on detecting each decoded datum of the decoded signal in each time slot.

On detecting such a decoded datum at a current time slot, it is possible to refer to only those of the survivor paths which are within a predetermined number B of time slots, including the current time slot as a latest one of the predetermined number of time slots. The predetermined number of time slots are called "B branch intervals" in the Clark, Jr. et al patent and may be six times the constraint length or shorter according to the patent.

The path memory may therefore memorize the survivor paths for the predetermined number of time slots at each time slot. The predetermined number of time slots may alternatively be called a "discarding" or "discontinuance" path length because the survivor path or paths prior to the predetermined number of time slots are discarded.

Although not illustrated in FIG. 3, the above-described path and metric memories are comprised by a conventional Viterbi decoder. In the Clark, Jr. et al patent, the path memory corresponds to the shift register for the "trellis connection data". The metric memory corresponds to a combination of the registers for the "cumulative correlations". The path and the metric memories are collectively described as a "random access path and path metric memory" in U.S. Pat. No. 3,872,432 issued to Otto Herbert Bismarck, assignor to International Telephone and Telegraph Corporation.

In FIG. 3, the decoded data detecting circuit of the conventional Viterbi decoder is for convolutional codes of the constraint length of three and the encoding rate of ½ and comprises a maximum metric detector 20 and a selection circuit 30. The detector 20 comprises first through third comparators 21, 22, and 23 and first and second selectors 26 and 27. The first comparator 21 produces a first selecting signal which indicates the greater of, for example, the first and the second metrics M1 and M2 supplied from the metric memory. Responsive to the first selecting signal, the first selector 26 selects the greater of the first and the second metrics M1 and M2. In this event, the second comparator 22 produces a second selecting signal which is indicative of the greater of the third and the fourth metrics M3 and M4 supplied from the metric memory. Responsive to the second selecting signal, the second selector 27 selects the greater of the third and the fourth metrics M3 and M4. The third comparator 23 produces a third selecting signal which indicates the greater of the metrics selected by the first and the second selectors 26 and 27, respectively. Additional first through third selectors 31, 32, and 33 constituting the selection circuit 30 are responsive to the first through the third selecting signals, respectively, for eventually selecting one of the information bits D1 through D4 supplied from the path memory that corresponds to the greatest of the metrics M1 through M4 and consequently represents the currently selected survivor path which indicates either of the message digits 0 and 1 as a decoded datum DEC.

The decoded data detecting circuit comprises a considerable number of circuit elements, namely, has a large hardware scale. The number exponentially increases with an increase in the constraint length K in the manner exemplified in Table 1 hereunder.

TABLE 1

|  | K = 3 | K = 4 | K = 5 | K = 6 | K = 7 |
|---|---|---|---|---|---|
| Comparator | 3 | 7 | 15 | 31 | 63 |
| Selector | 5 | 13 | 29 | 61 | 125 |
| Total | 8 | 20 | 44 | 92 | 188 |

Figure 4:
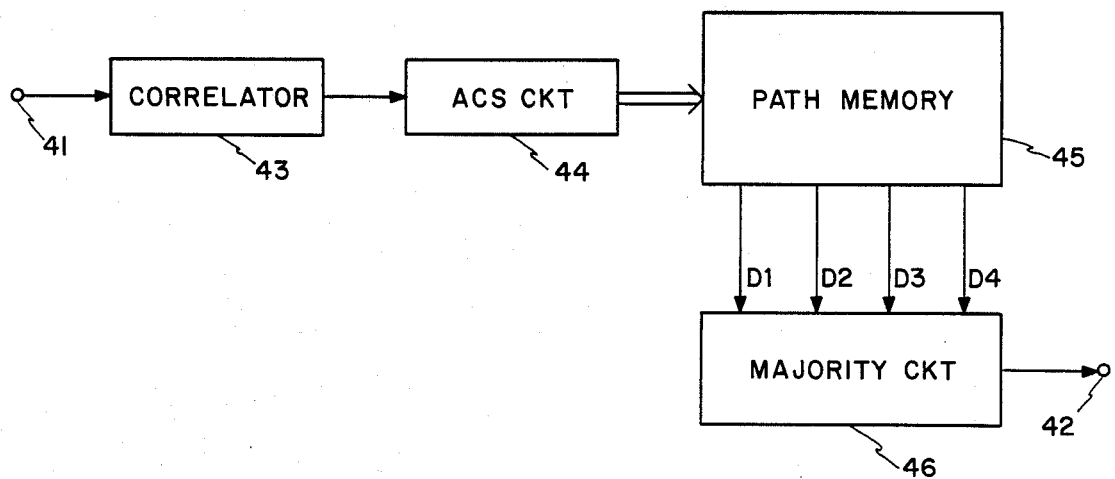
FIG. 4 is a block diagram of a Viterbi decoder according to an embodiment of the instant invention.

Referring now to FIG. 4, a Viterbi decoder according to an embodiment of this invention has decoder input and output terminals 41 and 42 which are supplied with the received code sequence and the decoded signal, respectively. The above-described correlator, the ACS circuit, and the path memory are depicted at 43, 44, and 45. Responsive to the received code sequence, the correlator 43 calculates two correlation measures at each time slot when the constraint length is three. Supplied with the correlation measures calculated for the code words received up to each time slot, the ACS circuit 44 produces a path signal representative of one of the first through the fourth information bits D1, D2, D3, and D4 at each time slot in the manner described hereinabove. The ACS circuit 44 need not produce the metrics M1 through M4 for a majority circuit described hereinafter. A combination of the correlator 43 and the ACS circuit 44 is therefore responsive to the received code words for selecting, at successive time slots, the first through the fourth survivor paths to produce the information bits D1 through D4 which are descriptive of the respective survivor paths and therefore associated therewith.

The path signal is delivered to the path memory 45. At each time slot, the path memory 45 memorizes the information bits D1 through D4 as representatives of the survivor paths of the predetermined number B of time slots which include the time slot in question as a latest one of the predetermined number of time slots.

A majority circuit 46 is for deciding, at each time slot, a majority of the information bits D1 through D4 supplied from the path memory 45 for the survivor paths of the predetermined number of time slots. The majority circuit 46 may select a predetermined one of the information bits 0 and 1 if the number of the information bits 0's and the number of the information bits 1's are equal to each other in the information bits D1 through D4. At any rate, the majority circuit 46 thereby produces a decoded datum of the decoded signal. The decoded datum is obtained in this manner at each current time slot by the majority decision because the information bits D1 through D4 which are descriptive of the survivor paths entering those of the state nodes converge to the decoded data and little contribute to the currently decided decoded datum which are more than the predetermined number of time slots prior to the current time slot. The majority circuit 46 serves as the decoded data detecting circuit illustrated with reference to FIG. 3. In other words, the majority circuit 46 need not use the metrics M1 through M4.

The majority circuit 46 may be a majority decision memory comprising an integrated circuit available on the market. For an encoded code sequence of a short constraint length, the majority circuit 46 may comprise a combination of AND and OR gates. When the constraint length is three, the majority circuit 46 is implemented by four AND gates and a single OR gate. When the Viterbi decoder is operable by an internal high-speed clock sequence, it is possible to implement the majority circuit 46 by a parallel-to-series converter and a counter. The converter may comprise a shift register. In any event, the majority circuit 46 is realized by a simple circuit on a small hardware scale.

TABLE 2

|  | K = 3 | K = 4 | K = 5 | K = 6 | K = 7 |
|---|---|---|---|---|---|
| Ckt element | 1 | 1 | 3 | 5 | 9 |

TABLE 3

|  | K = 3 | K = 4 | K = 5 | K = 6 | K = 7 |
|---|---|---|---|---|---|
| Shift register | 1 | 1 | 1 | 2 | 4 |
| Counter | 1 | 1 | 2 | 2 | 2 |
| Total | 2 | 2 | 3 | 4 | 6 |

In Table 2 given above, the number of read-only memories or memory is listed for various constraint lengths K for a majority decision memory. Table 3 shows the numbers of circuit elements for a majority circuit 46 comprising the parallel-to-series converter and the counter.

Figure 5:
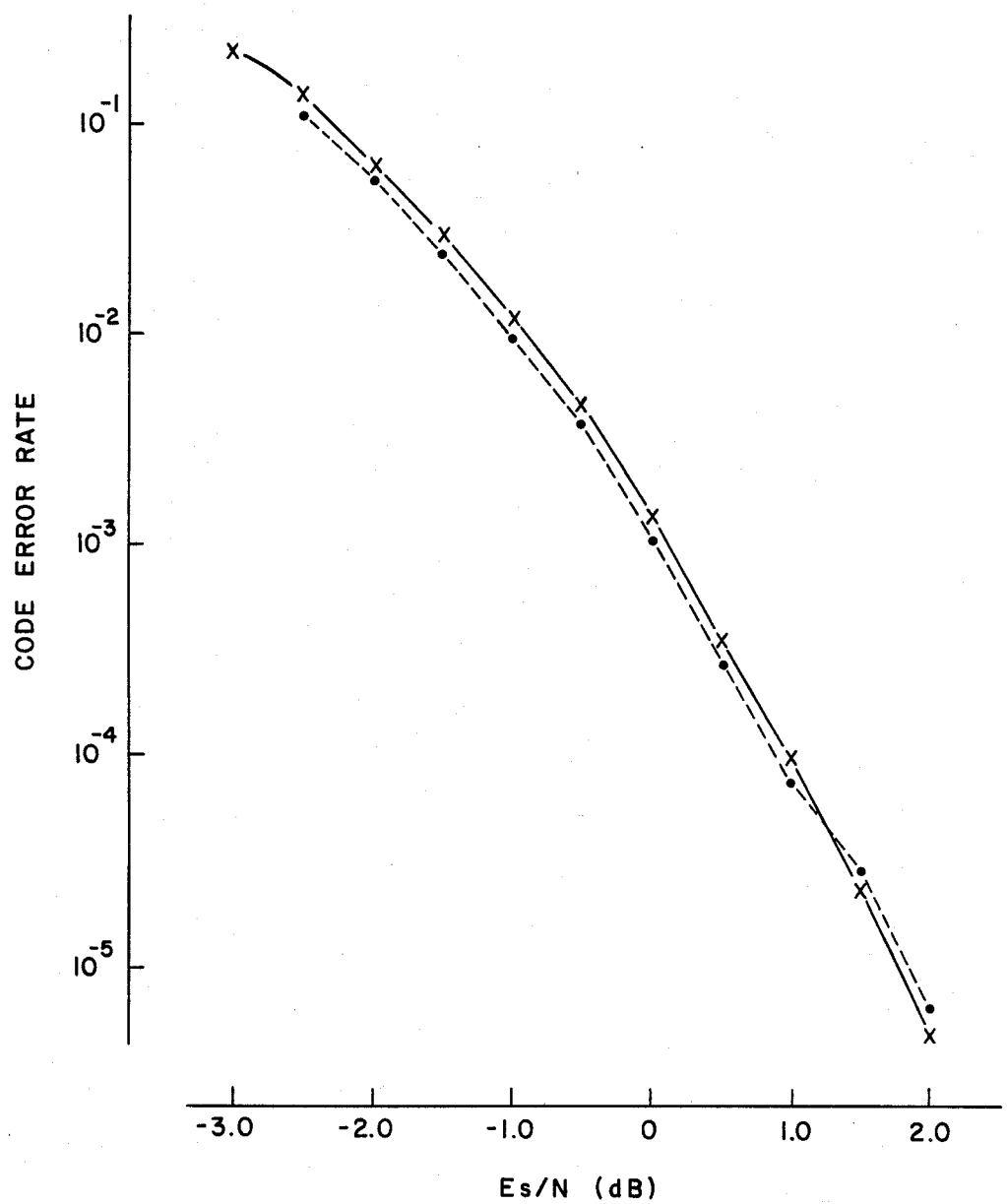
FIG. 5 shows code error rates for a conventional Viterbi decoder and a Viterbi decoder of the type depicted in FIG. 4.

Finally referring to FIG. 5, code error rates were measured for a conventional Viterbi decoder and a Viterbi decoder of the type illustrated with reference to FIG. 4. The predetermined number B was 41 depending on the definition of the number B. A noise source of $\alpha=0.6$ was used in varying the signal-to-noise ratio of the symbols Es/N. The code error rates are plotted by dots for the conventional Viterbi decoder and by crosses for the Viterbi decoder according to this invention. It will be appreciated that the Viterbi decoder according to this invention has as excellent a code error rate as the conventional Viterbi decoder.

While this invention has thus far been described in conjunction with only one preferred embodiment thereof, it will now be readily possible for one skilled in the art to put this invention into effect in various other manners. Above all, it should be noted that the survivor path is selected at each state node from more than two transition paths when the convolutional code sequence has a constraint length of more than three.

What is claimed is:

1. A Viterbi decoder for use in producing a decoded signal by correcting and decoding convolutional codes in synchronism with a succession of time slots, said Viterbi decoder including a path memory for memorizing, at each of said time slots, survivor paths in terms of information bits associated with the respective survivor paths of a predetermined number of time slots, and a majority circuit consisting of a read-only memory for deciding a decoded datum of said decoded signal for each of the time slots to provide a predetermined one of said information bits 0 and 1 in response to a majority of said information bits and to provide a predetermined one of said information bits 0 and 1 in response to a tie situation where the number of said information bits 0 equals the number of said information bits "1".

2. A Viterbi decoder as claimed in claim 1, wherein said predetermined number of the time slots is equal to at least six times a predetermined code length of said convolutional codes.

* * * * *